United States Patent [19]
Arai et al.

[11] Patent Number: 5,827,908
[45] Date of Patent: Oct. 27, 1998

[54] NAPHTHALENE AND OR BIPHENYL SKELETON CONTAINING EPOXY RESIN COMPOSITION

[75] Inventors: Kazuhiro Arai; Tadaharu Ikeda; Toshio Shiobara, all of Gunma-ken, Japan

[73] Assignee: Shin-Etsu Chemical Co., Ltd., Tokyo, Japan

[21] Appl. No.: 796,544

[22] Filed: Feb. 6, 1997

Related U.S. Application Data

[63] Continuation-in-part of Ser. No. 688,681, Jul. 29, 1996, abandoned, which is a continuation of Ser. No. 377,247, Jan. 24, 1995, abandoned.

[30] Foreign Application Priority Data

Jan. 26, 1994 [JP] Japan .................................. 6-023684

[51] Int. Cl.$^6$ ............................... C08K 3/20; C08K 3/34; C08K 3/36; C08L 63/00
[52] U.S. Cl. ......................... 523/212; 523/213; 523/427; 523/440; 523/443; 523/444; 523/457; 523/466
[58] Field of Search .................................... 523/427, 466, 523/457, 440, 212, 213, 443, 444

[56] References Cited

U.S. PATENT DOCUMENTS

| | | | |
|---|---|---|---|
| 3,704,806 | 12/1972 | Plachenov et al. | 523/466 |
| 5,162,400 | 11/1992 | Shiobara et al. | 523/466 |
| 5,166,228 | 11/1992 | Shiobara et al. | 523/466 |
| 5,244,707 | 9/1993 | Shores | 523/466 |
| 5,298,548 | 3/1994 | Shiobara et al. | 523/466 |
| 5,591,379 | 1/1997 | Shores | 523/466 |

FOREIGN PATENT DOCUMENTS 7216196  8/1995  Japan .

OTHER PUBLICATIONS

Kirk–Othmer, Encyclopedia of Chemical Technology, 4th ed., John Wiley & Sons, New York, vol. 7, pp. 1031–1045 (1994).

*Primary Examiner*—Donald R. Wilson
*Attorney, Agent, or Firm*—Birch, Stewart, Kolasch & Birch, LLP

[57] ABSTRACT

An epoxy resin composition is provided that mainly comprises an epoxy resin, a curing agent, and an inorganic filler, and that cures into a product having a coefficient of water diffusion of up to $1\times10^{-4}$ cm$^2$/hr. at a thickness of 3 mm under humid conditions at 85° C. and RH 85%, wherein 1–50% by weight of an inorganic water absorbing agent such as molecular sieve, silica gel and porous silica is added to the epoxy resin composition. The composition offers cured products having fully low moisture permeability and is thus suitable as a pre-molded hollow package-forming material.

17 Claims, 1 Drawing Sheet

NAPHTHALENE AND OR BIPHENYL SKELETON CONTAINING EPOXY RESIN COMPOSITION

CROSS REFERENCE TO RELATED APPLICATION

This application is a continuation-in-part of application Ser. No. 08/688,681 filed on Jul. 29, 1996, now abandoned, which is a continuation of application Ser. No. 08/377,247, filed Jan. 24, 1995, now abandoned, the entire contents of which are hereby incorporated by reference.

BACKGROUND OF THE INVENTION

1. Field of the Invention

This invention relates to an epoxy resin composition which cures into a low moisture permeable product and is thus suitable for use as pre-molded hollow package material.

2. Prior Art

Nowadays plastics are used in a wide variety of fields because of their numerous advantages such as mass production, low cost, ease of processing and electrical insulation. New plastics have been successively developed with the advance of synthetic chemistry. Although strength is regarded as one drawback of plastics, plastics can be reinforced with different materials. Toughness is also increasing since the advent of reinforced plastics. It is thus expected that plastics will mark a substantial increase in production quantity as building materials, transportation packaging materials and structural materials.

Among various plastics, epoxy resins find a wide variety of applications as insulating materials, laminates, composite materials, adhesives, paints and semiconductor encapsulants since they have a good balance of cured physical properties, especially moisture resistance and adhesion.

Semiconductor encapsulant is one of important applications of epoxy resins. Conventional epoxy resin compositions for use as semiconductor encapsulants include ortho-cresol novolak type epoxy resins and phenol novolak resin curing agents. Low water absorption is one of most important requirements for the semiconductor encapsulant because suppressing water absorption of packages themselves is recognized best means for increasing the crack resistance upon solder thermal impact after moisture absorption in a reliability test. For this reason, it is believed effective to blend naphthalene and biphenyl skeleton-containing epoxy resins having lower water absorption than the conventional ortho-cresol novolak type epoxy resins in epoxy resin compositions for use as semiconductor encapsulants. Also as to the curing agents, it is believed effective to use aralkyl, dicyclopentadiene, and terpene skeleton-containing phenolic resins having lower water absorption instead of the conventional phenol novolak resins.

Metals and ceramics are essentially impermeable to moisture whereas plastics are permeable to moisture. Plastics have inherent coefficients of water diffusion and when exposed to humid conditions, absorb or transmit water in accordance with their coefficient of water diffusion. Therefore, when plastics are utilized in applications requiring water-proofness and gas-tightness, for example, precision machines such as watches and electronic calculators and electronic parts such as semiconductor packages, especially solid-state camera element (CCD) sealing hollow packages, the moisture permeability of plastics is often a problem. When exposed to a hot humid environment for a long time instead of direct contact with water, CCD sealing hollow packages of plastic material gradually absorb water or transmit moisture. If moisture is available in the gas-tight space beyond the saturated water vapor quantity determined from the saturated water vapor pressure, moisture will condense so that the device becomes inoperable.

Therefore, an improvement in moisture permeability has been a task to be cleared for epoxy resin compositions to find use as semiconductor encapsulants.

SUMMARY OF THE INVENTION

An object of the present invention is to provide a novel and improved epoxy resin composition which cures into a product of quality having minimal moisture permeability.

We have found that by adding at least 1% by weight of an inorganic water absorbing agent to an epoxy resin composition comprising a naphthalene skeleton-containing or biphenyl skeleton-containing epoxy resin, a naphthalene skeleton-containing or aralkyl skeleton-containing phenolic resin as a curing agent, and an inorganic filler, which composition cures into a product having a coefficient of water diffusion of up to $1\times10^{-1}$ cm$^2$/hr. as measured with a gage or thickness of 3 mm under hot humid conditions at 85° C. and RH 85%, there is obtained an epoxy resin composition which cures into a product of quality having minimal moisture permeability and is thus adequate as a pre-molded hollow package-forming material.

It is of first concern how to reduce the moisture permeability of a cured product of an epoxy resin composition. It is believed that the following relationships are generally found between percent water absorption and moisture permeability.

Coefficient of water diffusion D (cm$^2$/hr)=$q^2 k^2 / 2.266^2 Q^2 t$ (provided q/Q<0.55)

Moisture permeability K (mg·cm/cm$^2$·hr)=$DQ_v$=10dDQ

Q: saturated water absorption (% by weight)

q: water absorption (% by weight) at time t (hr)

k: sample thickness (cm)

$Q_v$: saturated water absorption quantity (mg/cm$^3$)

d: sample density (g/cm$^3$)

It is understood from these relationships that the moisture permeability of a cured product can be reduced by reducing at least one of the percent saturated water absorption and the coefficient of water diffusion. To this end, it is effective to use low water absorbing epoxy resins such as naphthalene and biphenyl skeleton-containing epoxy resins and low water absorbing curing agents such as naphthalene and aralkyl skeleton-containing phenolic resins.

With respect to components of epoxy resin compositions, an inorganic filler is essential as well as an epoxy resin and curing agent. The inorganic filler plays the main role of reducing the coefficient of expansion of a cured product to minimize stresses while it is regarded as having essentially zero water absorption. As the inorganic filler is added in more amounts, the relative proportion of organic components in the composition decreases so that the percent water absorption may be reduced. It is then necessary to control the amount of inorganic filler added. From this point of view, an epoxy resin composition mainly comprising an epoxy resin, a curing agent, and an inorganic filler should be defined as curing into a product having a coefficient of water diffusion of up to $1\times10^{-4}$ cm$^2$/hr. as measured when a cured product of 3 mm thick is exposed to hot humid conditions at 85° C. and RH 85%.

However, mere use of a curable epoxy resin composition having a low coefficient of water diffusion as defined above is insufficient as a hollow package material. Means for further reducing moisture permeability is by adding at least 1% by weight of an inorganic water absorbing agent so that the agent may adsorb water contents penetrating through the cured product to thereby suppress the rate of transmission of water. Like the inorganic water absorbing agent, organic water absorbing resins might occur as the water absorbing agent, but are inadequate because they undergo volume expansion simultaneously with water absorption.

In this way, although an epoxy resin composition is essentially prone to water penetration, the present invention intends to minimize the inherent moisture permeability of an epoxy resin composition by combining selected components so as to reduce the coefficient of water diffusion of a cured product and to trap water penetrating through the cured product by adding an inorganic water absorbing agent. Then hollow packages formed from the epoxy resin composition are outstandingly extended in life. There are obtained reliable pre-molded hollow packages.

Accordingly, the present invention provides an epoxy resin composition comprising at least one epoxy resin having an epoxy equivalent of 100 to 400 selected from the group consisting of a naphthalene skeleton-containing epoxy resin of the following formula (I):

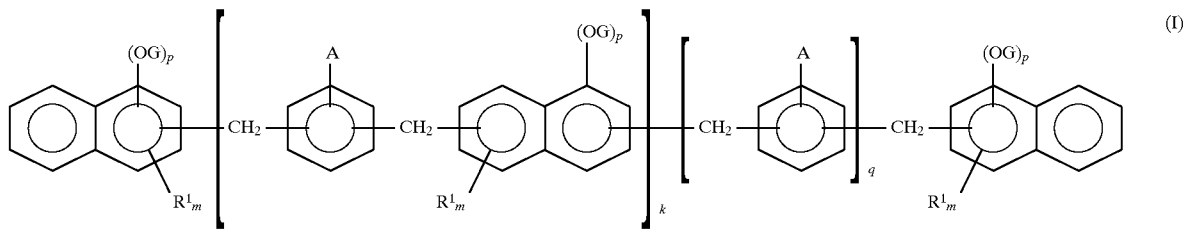

wherein $R^1$ is an alkyl group having 1 to 10 carbon atoms, OG is a glycidoxy group, A is a hydrogen atom or glycidoxy group, letter k is an integer of 0 to 5, q is an integer of 0 to 3, m is an integer of 0 to 2, and p is equal to 1 or 2, OG groups may be attached to either or both rings of the naphthalene nucleus, and a biphenyl skeleton-containing epoxy resin of the following formula (II):

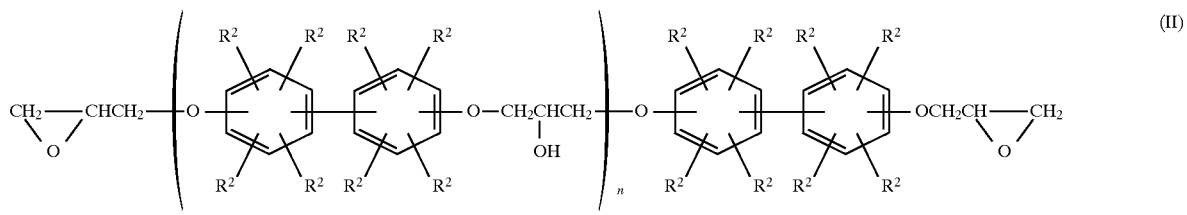

wherein $R^2$ is a hydrogen atom, halogen atom or monovalent hydrocarbon group having 1 to 5 carbon atoms, and letter n is an integer of 0 to 5, at least one curing agent having a hydroxyl equivalent of 90 to 250 selected from the group consisting of a naphthalene skeleton-containing phenolic resin of the following formula (III):

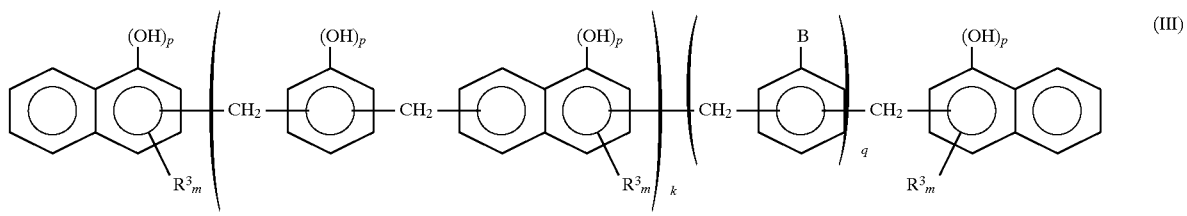

wherein $R^3$ is an alkyl group having 1 to 10 carbon atoms, B is a hydroxyl group or hydrogen atom, letter k is an integer of 0 to 5, q is an integer of 0 to 3, m is an integer of 0 to 2, and p is equal to 1 or 2, OH groups may be attached to either or both rings of the naphthalene nucleus, and an aralkyl skeleton-containing phenolic resin of the following formula (IV):

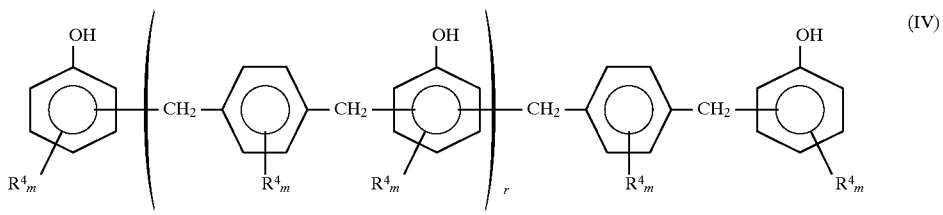

wherein $R^4$ is a hydrogen atom or alkyl group having 1 to 10 carbon atoms, letter m is an integer of 0 to 2, and r is an integer of 1 to 5,

- in an amount of 50 to 80 parts by weight per 100 parts by weight of the epoxy resin,
- an inorganic filler having a mean weight diameter of about 5 to 30 μm in an amount of about 200 to 1200 parts by weight per 100 parts by weight of the epoxy resin and curing agent combined, and
- an inorganic water absorbing agent having a mean weight diameter of 0.5 to 20 μm selected from the group consisting of molecular sieve, silica gel, porous silica having a specific surface area of 10 to 200 m²/g, and active alumina other than said inorganic filler, in an amount of 1 to 50% by weight based on the weight of the entire composition, said inorganic water absorbing agent being regenerated at 200° to 300° C. for about 2 to 12 hours prior to use,
- said composition curing into a product having a coefficient of water diffusion of up to $1 \times 10^{-4}$ cm²/hr. as measured at a thickness of 3 mm under humid conditions at 85° C. and RH 85%.

BRIEF DESCRIPTION OF THE DRAWINGS

The only FIGURE.

DETAILED DESCRIPTION OF THE INVENTION

Figure 1:
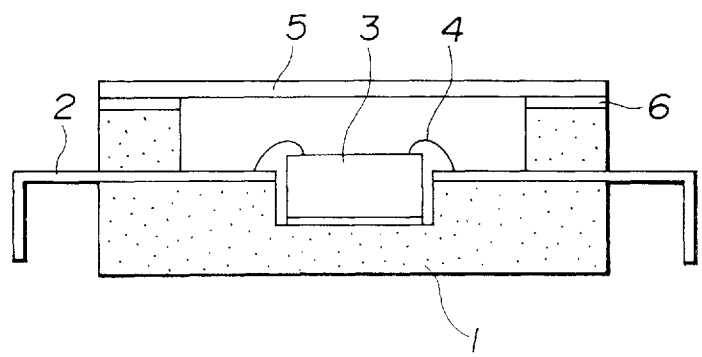
FIG. 1 is a schematic view of a test package for examining the reliability of CCD against moisture penetration.

A first component of the epoxy resin composition according to the invention is an epoxy resin which is preferably a naphthalene skeleton-containing epoxy resin. When an epoxy resin having a rigid naphthalene skeleton is used, there can be obtained a cured product having a low coefficient of expansion, a high glass transition temperature (Tg), low water absorption, and a low coefficient of water diffusion.

The naphthalene skeleton-containing epoxy resin is of the following formula.

In formula (I), $R^1$ is an alkyl group having 1 to 10 carbon atoms, such as a methyl and ethyl group, OG is a glycidoxy group represented by

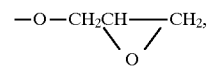

A is a hydrogen atom or glycidoxy group, letter k is an integer of 0 to 5, q is an integer of 0 to 3, m is an integer of 0 to 2, and p is equal to 1 or 2. OG groups may be attached to either ring of the naphthalene nucleus or simultaneously to both rings of the naphthalene nucleus.

Note that the naphthalene skeleton-containing epoxy resin should preferably contain less than 10% by weight of glycidyl ethers of α-naphthol and α,β-naphthol, more preferably less than 7% by weight from the standpoints of heat resistance and moisture resistance. Additionally the content of a binuclear compound consisting of phenol and phenyl glycidyl ether should preferably be less than 0.5% by weight, especially less than 0.2% by weight.

The naphthalene skeleton-containing epoxy resin should preferably have a softening point of 50° to 120° C., especially 70° to 110° C. and an epoxy equivalent of 100 to 400 although the softening point is largely affected by the content of glycidyl ethers of α-naphthol and α,β-naphthol in the resin. If an epoxy resin has a softening point of lower than 50° C., a cured product would have a lower Tg and fins and voids would be often formed during molding. If an epoxy resin having a softening point of higher than 120° C. is used, an epoxy resin composition would have a too high viscosity to mold.

Illustrative examples of the naphthalene skeleton-containing epoxy resin are given below.

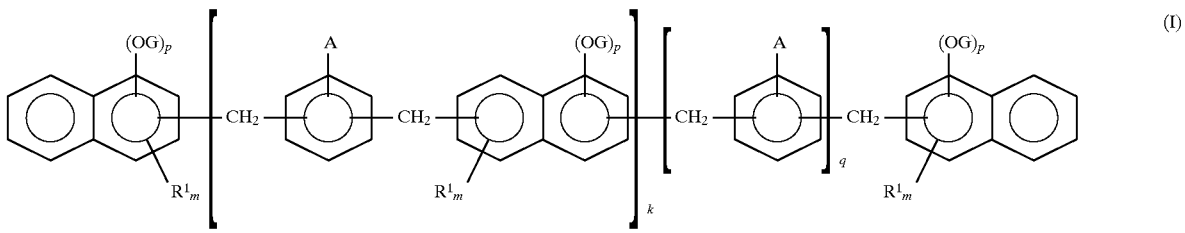

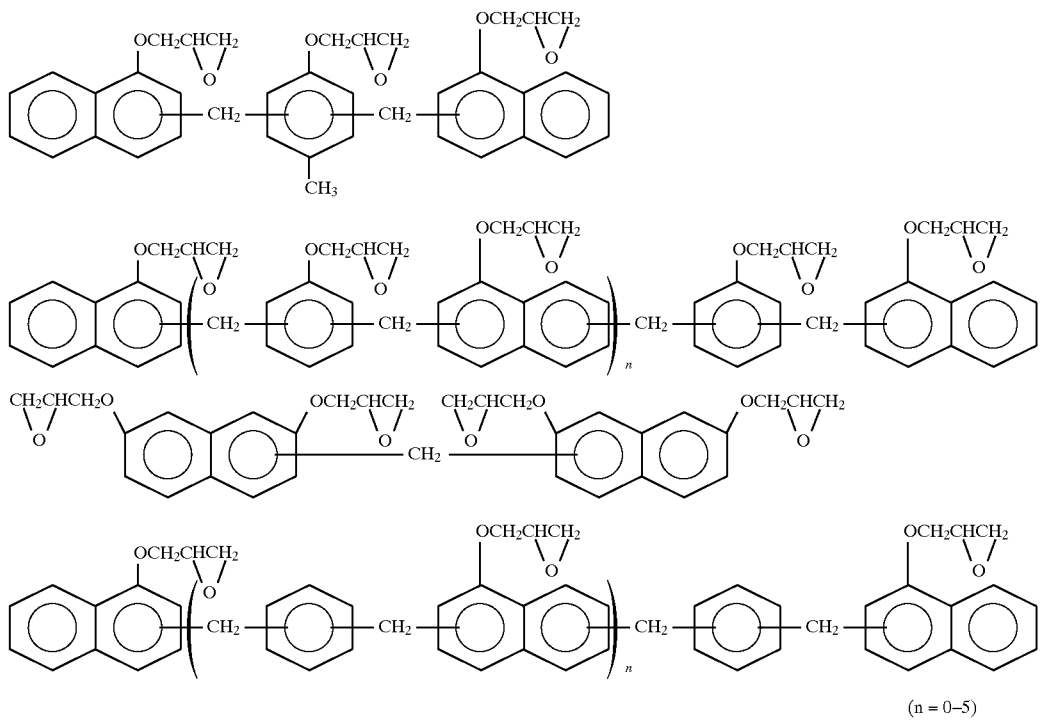

In order that an epoxy resin composition have an extremely low percent water absorption and good adhesion, the content of naphthalene nucleus in the entire epoxy resins should desirably range from about 5% to about 80% by weight, especially from about 10% to about 60% by weight. The amount of the naphthalene skeleton-containing epoxy resin blended is preferably adjusted so that the content of naphthalene nucleus may fall in this range.

Another useful epoxy resin is a biphenyl skeleton-containing epoxy resin. When a biphenyl skeleton-containing epoxy resin having a relatively low melt viscosity is used, there can be obtained a cured product having good adhesion, smooth flow, low water absorption, and a low coefficient of water diffusion.

The biphenyl skeleton-containing epoxy resin is of the following formula (II).

ethyl, propyl, butyl, and pentyl groups). The $R^2$ groups may be identical or different. Letter n is an integer of 0 to 5.

Illustrative examples of the biphenyl skeleton-containing epoxy resin are given below.

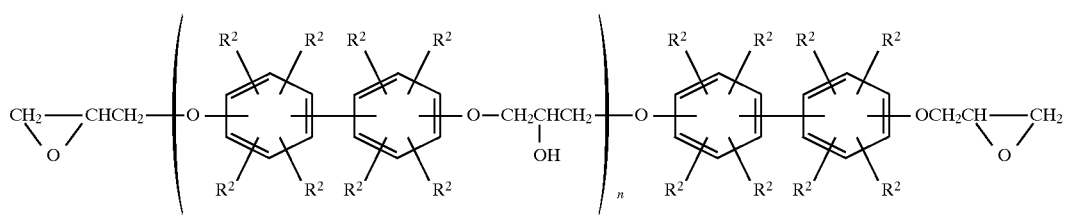

In formula (II), $R^2$ is a hydrogen atom, a halogen atom (e.g., chlorine, bromine and fluorine atoms) or a monovalent hydrocarbon group having 1 to 5 carbon atoms (e.g., methyl,

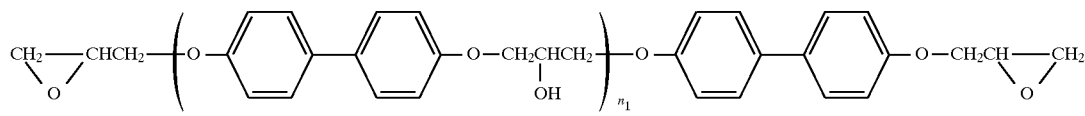

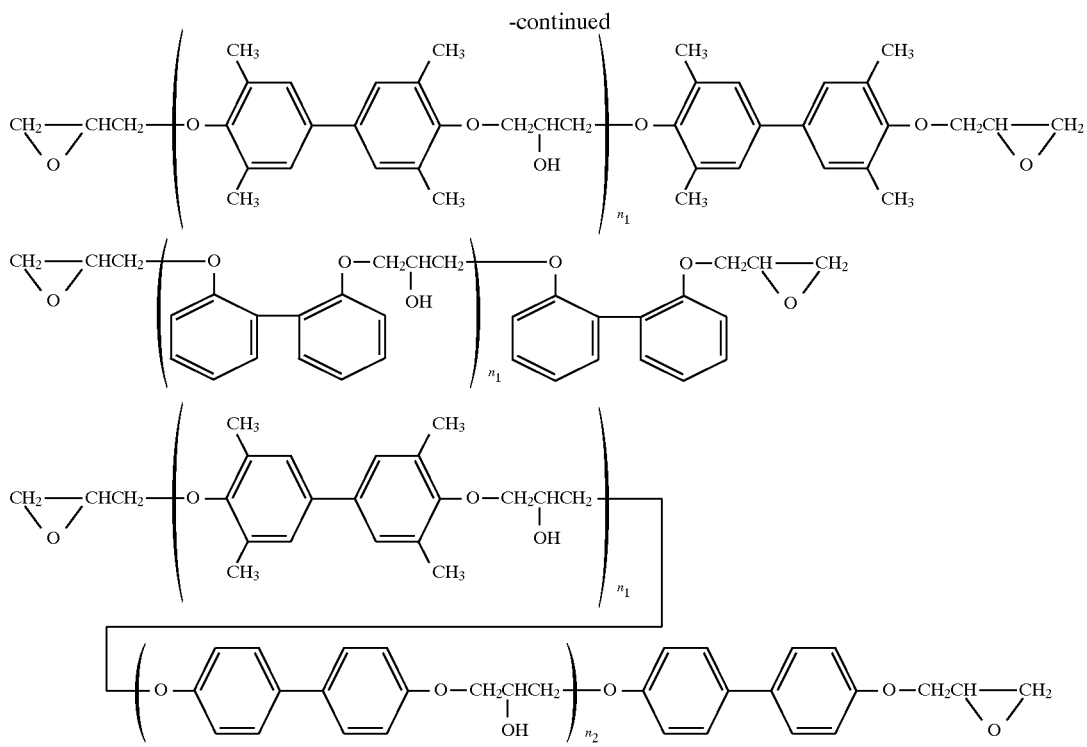

Note $n_1=0$ to 5, $n_2=0$ to 5, and $n_1+n_2=0$ to 5.

In the practice of the invention, either one of the naphthalene skeleton-containing epoxy resin and biphenyl skeleton-containing epoxy resin may be used alone or both the resins may be used together in any desired ratio.

When used for semiconductor encapsulation, the epoxy resins should preferably contain less than 1,000 ppm, especially less than 500 ppm of hydrolyzable chlorine and less than 10 ppm of sodium and potassium. If semiconductor devices are encapsulated with an epoxy resin containing more than 1,000 ppm of hydrolyzable chlorine or more than 10 ppm of sodium and potassium, the encapsulant would sometimes lose moisture resistance when the devices are allowed to stand under hot humid conditions for a long time. When an epoxy resin is selected by taking into account the above-mentioned factors, a reliable epoxy resin composition is obtained.

One or more of the other epoxy resins may be blended as an additional epoxy resin insofar as the benefits of the invention are not lost. Examples of the additional epoxy resin include epoxy resins having at least two epoxy groups in a molecule, for example, bisphenol A type epoxy resins, phenol novolak type epoxy resins, triphenol alkane type epoxy resins and polymers thereof, dicyclopentadiene-phenol novolak type epoxy resins, phenol aralkyl type epoxy resins, glycidyl ester type epoxy resins, cycloaliphatic epoxy resins, heterocyclic epoxy resins, brominated epoxy resins, and bishydroxybiphenyl system epoxy resins. The amount of the other epoxy resins should preferably be in the range of less than 50% by weight, especially 0 to 30% by weight in the entire epoxy resins.

A second component of the epoxy resin composition is a curing agent which is preferably a naphthalene skeleton-containing phenolic resin. The use of a naphthalene skeleton-containing phenolic resin ensures a cured product having a rigid backbone, heat resistance, low water absorption, and a low coefficient of water diffusion.

The naphthalene skeleton-containing phenolic resin is of the following formula (III).

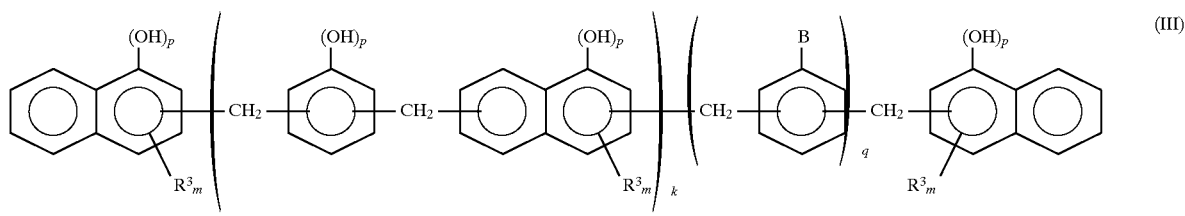

(III)

In formula (III), $R^3$ is an alkyl group having 1 to 10 carbon atoms, B is a hydroxyl group or hydrogen atom, letter k is an integer of 0 to 5, q is an integer of 0 to 3, m is an integer of 0 to 2, and p is equal to 1 or 2. OH groups may be attached to either ring of the naphthalene nucleus or simultaneously to both rings of the naphthalene nucleus.

Examples of the naphthalene skeleton-containing phenolic resin are given below.

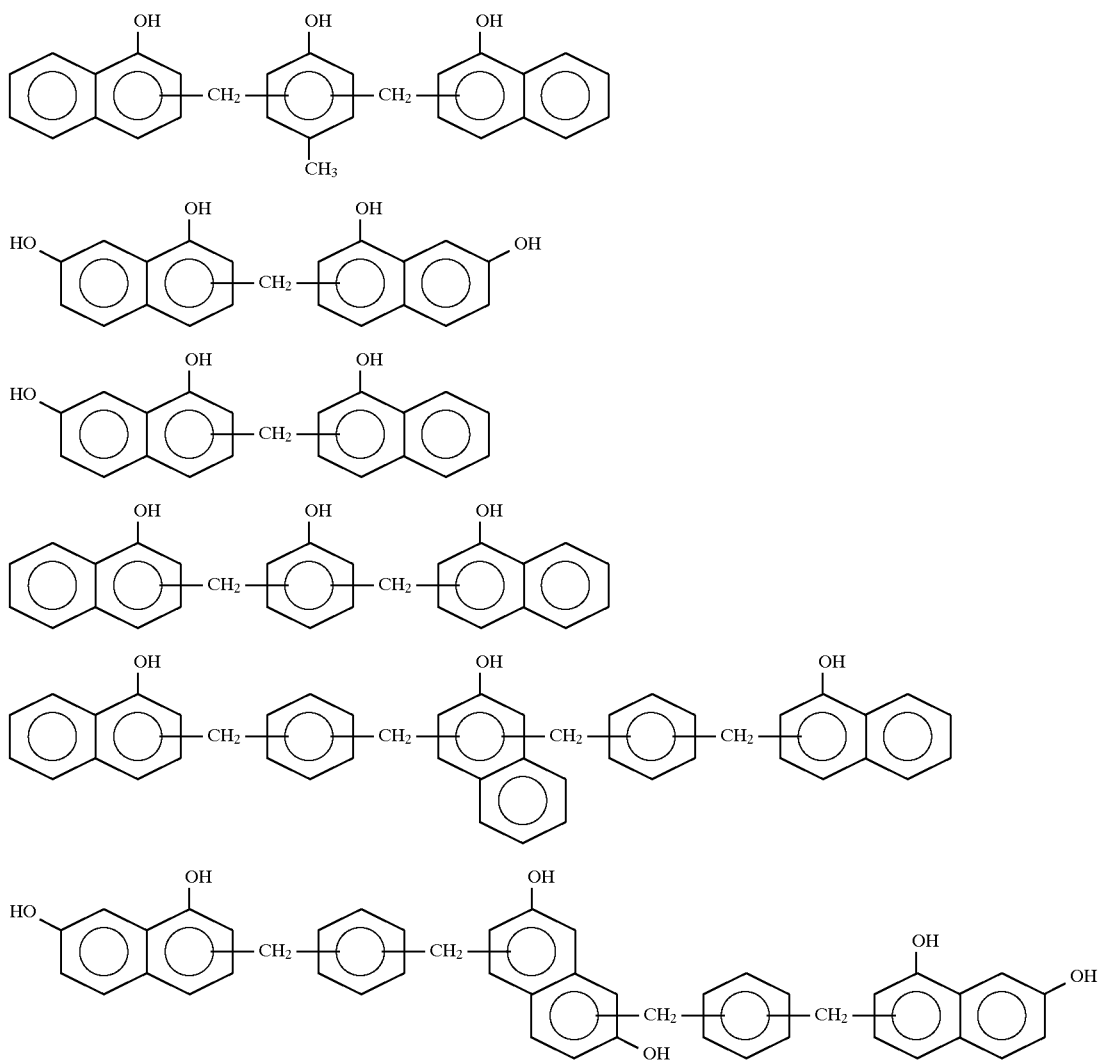

The naphthalene skeleton-containing phenolic resins should preferably have a softening point of 60° to 150° C., especially 70° to 130° C. and a hydroxyl equivalent of 90 to 250.

Another useful curing agent is an aralkyl skeleton-containing phenolic resin. The use of an aralkyl skeleton-containing phenolic resin ensures a good flow and a cured product having low water absorption and a low coefficient of water diffusion. The aralkyl skeleton-containing phenolic resin is of the following formula (IV).

In formula (IV), $R^4$ is a hydrogen atom or alkyl group having 1 to 10 carbon atoms, letter m is an integer of 0 to 2, and r is an integer of 1 to 5.

Examples of the aralkyl skeleton-containing phenolic resin are given below.

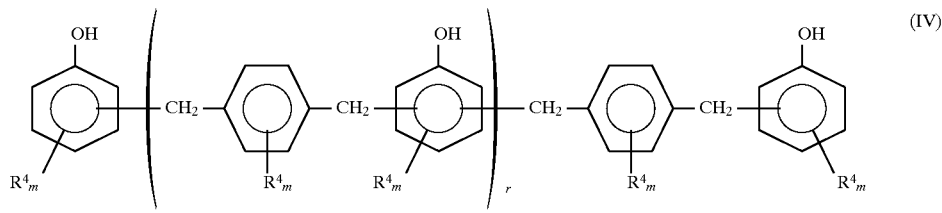

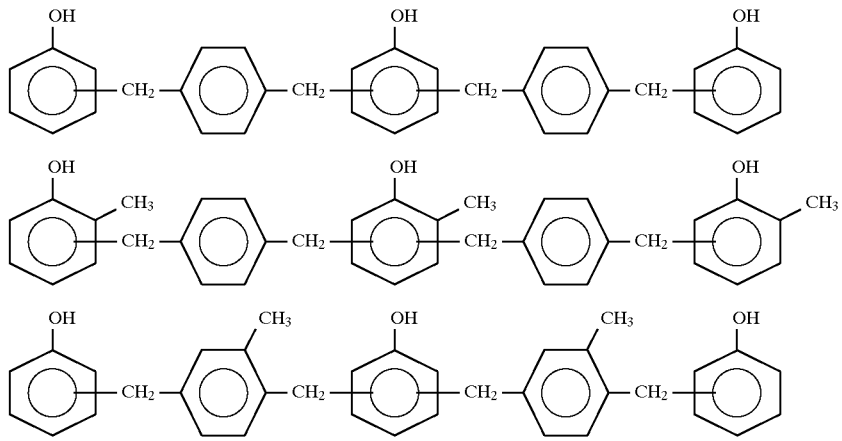

In the practice of the invention, either one of the naphthalene skeleton-containing phenolic resin and aralkyl skeleton-containing phenolic resin may be used alone or both the resins may be used together in any desired ratio.

When used for semiconductor encapsulation, the phenolic resins should preferably contain less than 10 ppm of sodium and potassium. If semiconductor devices are encapsulated using a phenolic resin containing more than 10 ppm of sodium and potassium, moisture resistance would sometimes be acceleratedly deteriorated when the devices are allowed to stand under hot humid conditions for a long time.

One or more of the other phenolic resins or analogues may be used as the curing agent insofar as the benefits of the invention are not lost. The other phenolic resins include novolak type phenolic resins. The amount of the other phenolic resins should preferably be in the range of less than 50% by weight, especially 0 to 30% by weight in the entire phenolic resins.

The curing agent is blended in an amount of about 20 to 90 parts, more preferably about 50 to 80 parts by weight per 100 parts by weight of the epoxy resin.

A third component of the epoxy resin composition is an inorganic filler which plays the role of reducing a coefficient of expansion of an encapsulant for reducing stresses which can be applied to semiconductor elements. Typical fillers used herein are fused silica and crystalline silica in ground and spherical form. Alumina, silicon nitride, and alumina nitride are also useful. A blend of spherical and ground fillers or a spherical filler alone is preferably used to provide a compromise between suppressed expansion of a cured product and moldability. The inorganic filler has a mean weight diameter of about 5 to 30 $\mu$m by laser beam diffraction analysis. Preferably the inorganic fillers are surface treated with silane coupling agents prior to use.

The inorganic filler is blended in an amount of about 200 to 1,200 parts by weight per 100 parts by weight of the epoxy resin and curing agent combined. With less than 200 parts of the filler on this basis, a cured product would have a higher coefficient of expansion to increase the stresses applied to semiconductor elements, causing deterioration of element performance. With more than 1,200 parts of the filler, an epoxy resin composition would have a sufficiently high viscosity to hinder molding.

The epoxy resin composition of the invention comprising an epoxy resin, a curing agent, and an inorganic filler as essential components cures into a product which should have a coefficient of water diffusion of up to $1\times10^{-1}$ cm$^2$/hr., preferably from $1\times10^{-5}$ to $7\times10^{-5}$ cm$^2$/hr. as measured with a gage of 3 mm under humid conditions at 85° C. and RH 85%. Differently stated, the respective components should be selected such that a cured product may have a coefficient of water diffusion within this range. If a cured product has a coefficient of after diffusion in excess of $1\times10^{-1}$ cm$^2$/hr., the main object of minimizing the moisture permeability of a cured product is not achieved. Then hollow packages formed from such an epoxy resin composition, which even contains an inorganic water absorbing agent, have a short life and are thus inadequate as pre-molded hollow packages which are required to be highly reliable.

In addition to the above-mentioned essential components, an inorganic water absorbing agent is blended in the epoxy resin composition as a fourth essential component. Examples of the inorganic water absorbing agent include molecular sieve, silica gel, porous silica and active alumina.

More particularly, molecular sieves are generally used as desiccants for organic solvents and characterized by a sharp pore diameter distribution at the surface. Molecular sieves having a pore diameter of 3 Å, 4 Å, 5 Å, 9 Å, and 10 Å are designated zeolite 3A, 4A, 5A, 10X, and 13X, respectively. Powder used as a source of conventional pellet type molecular sieve and having a suitable particle size distribution is an adequate inorganic water absorbing agent used herein.

Silica gel is generally used as desiccants for packages. Since a common type silica gel presents acidity due to the influence of silanolic hydroxyl groups at the surface and can adversely affect the curing and shelf storage of an epoxy resin composition, a modified type of silica gel exhibiting a substantially neutral surface acidity and having a controlled particle size distribution and water absorption is a preferred inorganic water absorbing agent used herein.

Porous silica should preferably have a specific surface area of 10 to 200 m$^2$/g (BET method), more preferably 20 to 100 m$^2$/g (BET method). Use of porous silica in spherical powder form is desirable when the flow of an epoxy resin composition is taken into account. Active alumina is crystalline alumina and is also useful as the inorganic water absorbing agent used herein.

With respect to the particle size distribution of the inorganic water absorbing agent, a mean weight diameter of 0.5 to 20 $\mu$m, preferably 1 to 10 $\mu$m by laser beam diffraction analysis is desirable in order to avoid any adverse effect on the properties of an epoxy resin composition. In blending, the inorganic water absorbing agents should be regenerated at 200° to 300° C. for about 2 to 12 hours, preferably at 250° to 300° C. for 4 to 10 hours prior to use. The regenerated inorganic water absorbing agent should preferably have a content of water adsorbed thereto (adsorbed water content) of 0.1% by weight or less (0 to 0.1% by weight), more preferably 0.08% by weight or less (0 to 0.08% by weight).

Further, the inorganic water absorbing agents may be treated at their surface with hydrophilic surface treating agents prior to use. The hydrophilic surface treating agent may be used in an amount of 0.2 to 4 parts by weight, especially 0.3 to 2 parts by weight per 100 parts by weight of the inorganic water absorbing agent. While inorganic fillers are generally treated at their surface with hydrophobic surface treating agents for improving the properties of a composition, the inorganic water absorbing agents favor the use of hydrophilic surface treating agents because the action of water absorbing agents to repel penetrating water at their surface is undesirable. Preferred examples of the hydrophilic surface treating agents include a hydrolyzate of tetraethoxysilane and the compounds represented by the formulae:

$(CH_3O)_3Si(CH_2)_3OH$, $H_2N(CH_2)_2NH(CH_2)_3Si(OC_2H_5)_3$, and $H_2N(CH_2)_3Si(OCH_3)_3$.

The inorganic water absorbing agent is used in an amount of 1 to 50% by weight, preferably 5 to 20% by weight based on the weight of an entire composition. Less than 1% of the inorganic water absorbing agent is not effective for reducing the moisture permeability of a cured product. More than 50% of the inorganic water absorbing agent would adversely affect the flow of an epoxy resin composition.

In addition to the above-mentioned essential components, any of conventional well-known curing accelerators is preferably added to the epoxy resin composition of the invention. Examples of the curing accelerator include imidazoles and derivatives thereof, phosphine derivatives, tertiary amines and derivatives thereof. The curing accelerator may be added in a conventional amount insofar as curing of an epoxy resin composition is not adversely affected.

Preferably a flexibility modifier of silicone type is added to the epoxy resin composition of the invention for stress reducing purposes. Exemplary flexibility modifiers include silicone rubber powder, silicone gel, and block polymers of an organic resin and a silicone polymer. It is understood that the inorganic filler may be treated at the surface with a two part type silicone rubber or silicone gel instead of adding such a flexibility modifier. The flexibility modifier is preferably used in an amount of about 0.5 to 10% by weight, more preferably about 1 to 5% by weight based on the weight of an entire composition. Less than 0.5% of the flexibility modifier would fail to provide impact resistance whereas more than 10% of the flexibility modifier would adversely affect mechanical strength.

Other optional components may be blended in the epoxy resin composition of the invention if desired and insofar as the benefits of the invention are not lost. The optional components include various well-known thermoplastic resins, mold release agents such as carnauba wax, higher fatty acids, and synthetic wax, silane coupling agents, and flame retardants such as brominated epoxy resins, antimony oxide, and phosphorus compounds.

With respect to the mold release agent, it is to be noted that a mold release agent which is well compatible with a curable epoxy resin composition should preferably be blended in an amount of 0 to 3 parts by weight, especially 1 to 2 parts by weight per 100 parts by weight of the epoxy resin and curing agent (phenolic resin) combined, insofar as molding is not disturbed. The reason is described below. In the manufacture of pre-molded semiconductor devices such as CCD, for example, an epoxy resin composition is molded as a hollow package, an element is mounted in the hollow cavity, and a glass lid is joined to a package opening. If an epoxy resin composition contains a large amount of a mold release agent incompatible with the epoxy resin, bleeding of the mold release agent to the package joint surface obstructs joining of the glass lid thereto. This necessitates an extra step of burning the package joint surface by means of a hydrogen flame burner or roughening the package joint surface with a file. Therefore, as the mold release agent, higher fatty acids such as stearamide and synthetic waxes such as polyethylene wax and montan wax are preferred to incompatible carnauba wax.

The epoxy resin composition of the invention is prepared by any desired process, for example, by agitating and mixing predetermined amounts of the above-mentioned components, milling the mixture in a kneader, roll mill or extruder pre-heated at 70° to 95° C., cooling the mixture and comminuting the mixture. The order of blending the components is not critical. When the mold release agent is used, however, it is preferably blended in the epoxy resin composition by adding the mold release agent to organic components (typically resins) of the composition, premixing them by means of a kneader or the like for fully dispersing the mold release agent, adding an inorganic filler and inorganic water absorbing agent to the dispersion, and mixing them. This mixing sequence improves mold release and water repellent effects.

As mentioned previously, the epoxy resin composition of the invention is advantageous as a material for pre-molded hollow packages. The composition may be pre-molded by any of conventional molding techniques, for example, transfer molding, injection molding and casting. Typically the composition is molded at a temperature of 150° to 180° C. and post cured at a temperature of 150° to 180° C. for about 2 to 16 hours.

The epoxy resin composition of the invention cures into a produce of quality having low moisture permeability and is useful as a pre-molded hollow package-forming material. Pre-molded hollow packages formed from the inventive composition have low enough moisture permeability to expand the range of serviceable conditions.

EXAMPLE

Examples of the present invention are given below by way of illustration and not by way of limitation. All parts are by weight.

Examples 1–8 and Comparative Examples 1–6

The components shown in Table 1 were thoroughly kneaded by a kneader while 1.5 parts of stearamide as a mold release agent was added to 100 parts of the organic components combined. To the mixture were added 1.5 parts of γ-glycidoxypropyltrimethoxysilane, 8.0 parts of antimony trioxide, 2.0 parts of carbon black, and 0.8 part of triphenyl phosphine. The blend was uniformly melt milled by a hot twin roll mill. In this way, fourteen epoxy resin compositions were prepared.

The epoxy resin compositions were examined for the following properties (1) to (6). The results are shown in Table 1.
(1) Spiral Flow
Spiral flow was measured at 175° C. and 70 kg/cm² using a mold as prescribed by the EMMI 1-66 Revision A.
(2) Mechanical Strength (Flexural Strength)
A bar of 10×100×4 mm was prepared by molding a composition at 175° C. and 70 kg/cm² for 2 minutes and post curing at 180° C. for 4 hours. Flexural strength was measured according to JIS K-6911.

(3) Glass Transition Temperature (Tg) and Coefficient of Linear Expansion (μ)

A text bar of 4×4×15 mm was prepared by molding a composition at 175° C. and 70 kg/cm² for 2 minutes and post curing at 180° C. for 4 hours. Measurement was done by heating the test bar at a rate of 5° C./min. using a dilatometer.

(4) Saturated Water Absorption and Coefficient of Water Diffusion

A cured disk having a diameter of 50 mm and a thickness of 3 mm was prepared by molding a composition at 175° C. and 70 kg/cm² for 2 minutes and post curing at 180° C. for 4 hours. The disk was allowed to stand in a hot humid atmosphere of 85° C. and RH 85% over 500 hours for water absorption before it was measured for percent water absorption. This percent water absorption is a saturated water absorption (Q).

The water absorbing time (t) passed until one-half of the saturated water absorption (Q/2) was reached was measured. A coefficient of water diffusion (D) was calculated according to the following formula.

D (cm²/hr)=q²k²/2.266²Q²t (within in the range: q/Q<0.55)

If q=Q/2 and k=0.3, then D=4.382×10⁻³/t.

Q: saturated water absorption (% by weight)
q: water absorption (% by weight) at time t (hr)
k: sample thickness (cm)

(5) Moisture Penetration Start Time

A cured disk having a diameter of 70 mm and a thickness of 0.5 mm was prepared by molding a composition a 175° C. and 70 kg/cm² for 2 minutes and post curing at 180° C. for 4 hours. The disk was measured for percent moisture permeability in a humid atmosphere of 40° C. and RH 90% according to the cup method of JIS Z-0208. Immediately after the start of measurement, only water absorption took place and no moisture penetration occurred through the disk. It was observed that moisture penetration started gradually after the lapse of a certain time. The time taken from water absorption to moisture penetration is a moisture penetration start time.

(6) Reliability of CCD Against Moisture Penetration

A pre-molded package in the form of a hollow box 1 with a lead frame 2 interposed therein as shown in FIG. 1 was prepared by molding a composition at 175° C. and 70 kg/cm² for 2 minutes and post curing at 180° C. for 4 hours. A silicon chip 3 was mounted in a hollow cavity of the package 1, and bonding wires 4 were connected in place. A transparent glass lid 5 was sealingly joined to an opening of the package 1 with an epoxy resin adhesive 6. A test assembly was completed in this way.

This gas-tightly sealed package was allowed to stand in a hot humid atmosphere of 85° C. and RH 85% over 250 hours and then observed at room temperature whether moisture condensed on the inside surface of the glass lid. Packages without dew condensation are rated "OK" and packages with dew condensation are rated "NG".

The components used in the epoxy resin composition are shown below.

Epoxy resin (1)

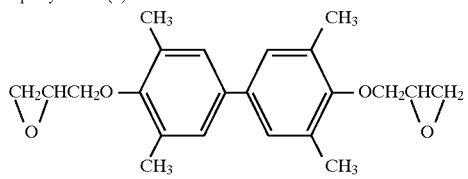

Yuka Shell Epoxy K.K.
YX-4000H
epoxy equivalent 190

Epoxy resin (2)

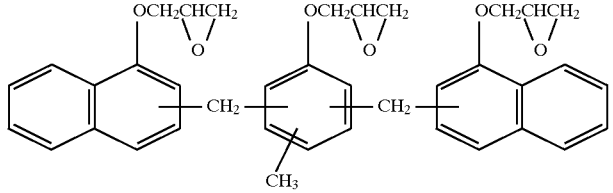

Nippon Kayaku K.K.
NC-7000
epoxy equivalent 220

Epoxy resin (3)

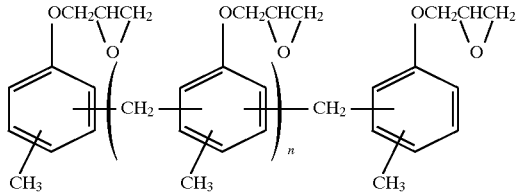

Nippon Kayaku K.K.
EOCN-1020
epoxy equivalent 200

Phenolic resin (1)

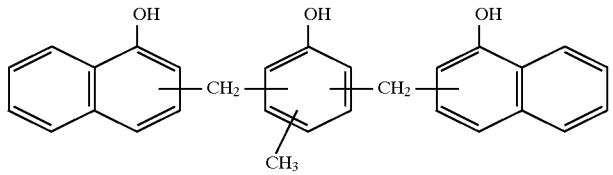

Nippon Kayaku K.K.
NH-7000
OH equivalent 140

-continued

Phenolic resin (2)

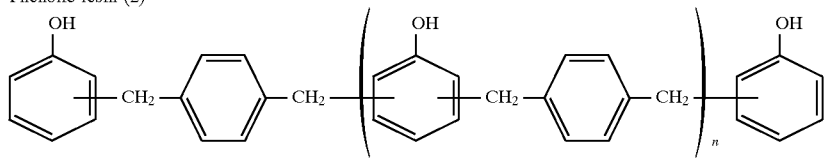

Mitsui Toatsu Chemical K.K.
XL225-3L
OH equivalent 170

Phenolic resin (3)

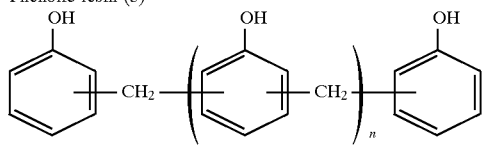

Dai-Nippon Ink K.K.
TD2093
OH equivalent 110

Brominated epoxy resin

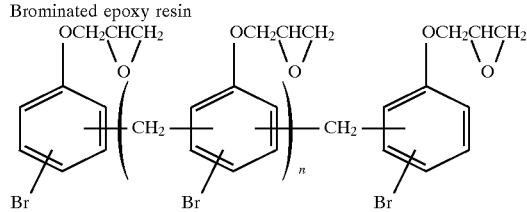

Nippon Kayaku K.K.
BREM-105
epoxy equivalent 280

Silicone-modified epoxy resin:
An addition reaction product between the following two compounds in a weight ratio of 2:1

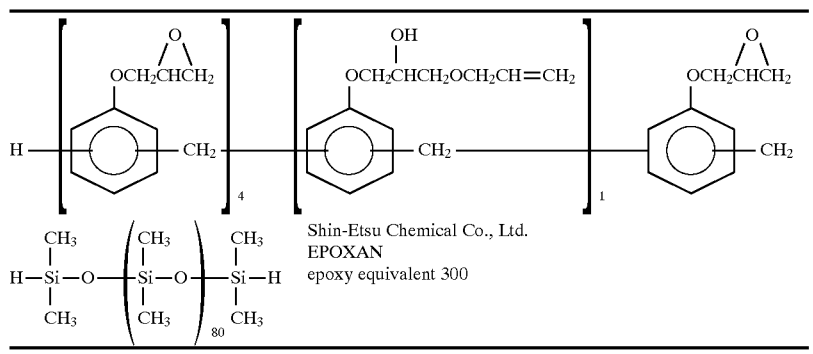

Shin-Etsu Chemical Co., Ltd.
EPOXAN
epoxy equivalent 300

(The numerals affixed to parentheses are average values.)

Molecular Sieve

Zeolite 3A powder having a mean weight diameter of 9.4 μm.

The molecular sieve was regenerated by heating it at 200° C. for 6 hours in a hot air circulating drier. The resulting molecular sieve had 0.05% by weight of water adsorbed.

Silica Gel

Silica gel ground powder having a mean weight diameter of 6.0 μm.

The silica gel was regenerated by heating it at 200° C. for 6 hours in a hot air circulating drier. The resulting silica gel had 0.04% by weight of water adsorbed.

Porous Silica

Silica powder having a mean weight diameter of 2.2 μm and a specific surface area of about 50 m$^2$/g measured by BET method.

The porous silica was regenerated by heating it at 250° C. for 10 hours in a hot air circulating drier. The resulting porous silica had 0.06% by weight of water adsorbed.

Surface-Treated Porous Silica

The same porous silica as above was surface treated in a dry nitrogen ($N_2$) atmosphere with 1.0% by weight of a silane coupling agent: $(CH_3O)_3Si(CH_2)_3OH$ Fused Spherical Silica A mean weight diameter of 20 μm.

The mean weight diameter is measured by laser beam diffraction analysis using Granulometer, available from CILAS ALCATEN (France).

TABLE 1

| Components (pbw) | Example 1 | 2 | 3 | 4 | 5 | 6 | 7 | 8 |
|---|---|---|---|---|---|---|---|---|
| Epoxy resin (1) | 9.2 | 9.2 | 9.2 | 9.2 | 9.2 | 9.2 | 10.3 | 9.2 |
| Epoxy resin (2) | 36.6 | 36.6 | 36.6 | 36.6 | 36.6 | 36.6 | 41.3 | 36.6 |
| Epoxy resin (3) | — | — | — | — | — | — | — | — |
| Phenolic resin (1) | 19.6 | 19.6 | 19.6 | 19.6 | 19.6 | 19.6 | 19.9 | 19.6 |
| Phenolic resin (2) | 19.6 | 19.6 | 19.6 | 19.6 | 19.6 | 19.6 | 19.9 | 19.6 |
| Phenolic resin (3) | — | — | — | — | — | — | — | — |
| Brominated epoxy resin | 8.6 | 8.6 | 8.6 | 8.6 | 8.6 | 8.6 | 8.6 | 8.6 |
| Silicone-modified epoxy resin | 6.4 | 6.4 | 6.4 | 6.4 | 6.4 | 6.4 | — | 6.4 |
| Fused spherical silica | 400 | 400 | 400 | 500 | 400 | 400 | 400 | 400 |
| Molecular sieve | 50 | — | — | — | — | 25 | 50 | 50 |
| Silica gel | — | 50 | — | — | — | — | — | — |
| Porous silica | — | — | 50 | 50 | 100 | 25 | — | — |
| Surface-treated porous silica | — | — | — | — | — | — | — | 50 |
| Properties | | | | | | | | |
| Spiral flow (cm) | 78 | 51 | 115 | 88 | 90 | 70 | 82 | 118 |
| Flexural strength (kg/cm$^2$) | 13.5 | 12.9 | 12.8 | 14.1 | 13.8 | 13.1 | 12.7 | 12.9 |
| Tg (°C) | 145 | 144 | 145 | 146 | 145 | 145 | 148 | 145 |
| $\mu$ (10$^5$/°C) | 1.3 | 1.3 | 1.3 | 1.2 | 1.2 | 1.3 | 1.3 | 1.3 |
| Saturated water absorption (wt %) | 2.2 | 2.4 | 2.4 | 1.9 | 2.1 | 2.3 | 2.2 | 2.6 |
| Coefficient of water diffusion (10$^{-5}$ cm$^2$/hr) | 6.1 | 5.5 | 4.2 | 3.3 | 3.9 | 5.8 | 5.7 | 4.0 |
| Water penetration start time (hr) | 175 | 150 | 200 | 275 | 250 | 200 | 200 | 250 |
| Reliability of CCD against water penetration | OK | OK | OK | OK | OK | OK | OK | OK |

| Components (pbw) | Comparative Example 1 | 2 | 3 | 4 | 5 | 6 |
|---|---|---|---|---|---|---|
| Epoxy resin (1) | 9.2 | 10.3 | — | — | — | — |
| Epoxy resin (2) | 36.6 | 41.3 | — | — | — | — |
| Epoxy resin (3) | — | — | 52.2 | 57.9 | 52.2 | 57.9 |
| Phenolic resin (1) | 19.6 | 19.9 | — | — | — | — |
| Phenolic resin (2) | 19.6 | 19.9 | — | — | — | — |
| Phenolic resin (3) | — | — | 32.8 | 33.5 | 32.8 | 33.5 |
| Brominated epoxy resin | 8.6 | 8.6 | 8.6 | 8.6 | 8.6 | 8.6 |
| Silicone-modified epoxy resin | 6.4 | — | 6.4 | — | 6.4 | — |
| Fused spherical silica | 450 | 450 | 450 | 450 | 400 | 400 |
| Molecular sieve | — | — | — | — | 50 | 50 |
| Silica gel | | | | | | |
| Porous silica | — | — | — | — | — | — |
| Surface-treated porous silica | — | — | — | — | — | — |
| Properties | | | | | | |
| Spiral flow (cm) | 97 | 52 | 54 | 65 | 45 | 49 |
| Flexural strength (kg/cm$^2$) | 12.9 | 12.9 | 13.2 | 13.3 | 13.1 | 12.9 |
| Tg (°C) | 145 | 151 | 154 | 151 | 154 | 152 |
| $\mu$ (10$^5$/°C) | 1.3 | 1.3 | 1.3 | 1.3 | 1.3 | 1.3 |
| Saturated water absorption (wt %) | 0.3 | 0.3 | 0.4 | 0.4 | 2.5 | 2.9 |
| Coefficient of water diffusion (10$^{-5}$ cm$^2$/hr) | 9.1 | 8.5 | 12.0 | 11.6 | 11.0 | 10.9 |
| Water penetration start time (hr) | 100 | 125 | 50 | 75 | 100 | 125 |
| Reliability of CCD against water penetration | NG | NG | NG | NG | NG | NG |

Reference Example

Some of the curable epoxy resin compositions used in Examples and Comparative Examples from which the inorganic water absorbing agent was omitted were measured for a coefficient of water diffusion. The procedure of preparing a cured test specimen and the procedure of measuring a coefficient of water diffusion were the same as described in (4) Saturated water absorption and coefficient of water diffusion. The results are shown in Table 2.

TABLE 2

| Components (pbw) | Reference Example 1 | 2 | 3 | 4 |
|---|---|---|---|---|
| Epoxy resin (1) | 9.2 | 10.3 | — | — |
| Epoxy resin (2) | 36.6 | 41.3 | — | — |
| Epoxy resin (3) | — | — | 52.2 | 57.9 |
| Phenolic resin (1) | 19.6 | 19.9 | — | — |
| Phenolic resin (2) | 19.6 | 19.9 | — | — |
| Phenolic resin (3) | — | — | 32.8 | 33.5 |
| Brominated epoxy resin | 8.6 | 8.6 | 8.6 | 8.6 |
| Silicone-modified epoxy resin | 6.4 | — | 6.4 | — |
| Fused spherical silica | 400 | 400 | 400 | 400 |
| Coefficient of water diffusion (10$^{-5}$ cm$^2$/hr) | 9.4 | 9.0 | 12.2 | 12.0 |

The data of Tables 1 and 2 show the following. Those compositions (Examples 1–3) obtained by adding an inorganic water absorbing agent to a curable epoxy resin composition curing into a product having a coefficient of water diffusion of less than $1\times10^{-1}$ cm$^2$/hr. as measured with a gage of 3 mm under hot humid conditions at 85° C. and RH 85% excel in low moisture permeability. A similar composition having a larger content of fused spherical silica as an inorganic filler (Example 4) and another similar composition having a larger content of inorganic water absorbing agent (Example 5) are further improved in low moisture permeability. Use of two inorganic water absorbing agents (Example 6) is effective in some humidifying atmosphere conditions or for some package shapes. An epoxy resin composition free of a silicone stress-releasing agent (Example 7) is better with respect to low moisture permeability. Addition of an inorganic water absorbing agent surface treated with a hydrophilic silane coupling agent (Example 8) is more effective.

In contrast, those compositions free of an inorganic water absorbing agent (Comparative Examples 1–4) fail to be low moisture permeable. Even with an inorganic water absorbing agent added, no desirably low moisture permeability is obtained if a cured product of a base epoxy resin composition has a coefficient of water diffusion in excess of $1\times10^{-4}$ cm$^2$/hr. (as seen from Comparative Examples 5–6 and Reference Examples 3–4).

It is to be noted that in the inventive compositions (Examples 1–8), stearamide, mold release agent is pre-mixed with the curable epoxy resin and thus uniformly dispersed in the compositions. After molding of the compositions, the cured products can be smoothly released from the mold. In addition, the cured products have water repellency and low moisture permeability.

Examples 9–15 and Comparative Examples 7–13

The components including an inorganic water absorbing agent shown in Tables 3 and 4 were thoroughly kneaded by a kneader while 1.5 parts by weight of stearamide as a mold release agent was added to 100 parts by weight of the organic components combined. To the mixture were added 1.5 parts by weight of γ-glycidoxypropyltrimethoxysilane, 8.0 parts by weight of antimony trioxide, 2.0 parts by weight of carbon black, and 0.8 part by weight of triphenyl phosphine. The blend was uniformly melt milled by a hot twin roll mil to prepare several epoxy resin compositions.

The inorganic water absorbing agent used was spherical porous silica (AMT-Silica #300B, manufactured by Mizusawa Industry Co., Ltd.) having an apparent density of 0.69 g/m$^3$, an oil absorption of 40 ml/100 g, a specific surface area (BET method) of 32.7 m$^2$/g, a pore volume of 0.35 ml/g, and a mean weight diameter of 2.8 μm which was regenerated as follows.

Inorganic Water Absorbing Agent (1)

The spherical porous silica was regenerated by heating it at 250° C. for 10 hours in a hot air circulating drier. The resulting silica had 0.06% by weight of water adsorbed.

Inorganic Water Absorbing Agent (2)

The spherical porous silica was regenerated by heating it at 300° C. for 6 hours in a hot air circulating drier. The resulting silica had 0.05% by weight of water adsorbed.

Inorganic Water Absorbing Agent (3)

The spherical porous silica was regenerated by heating it at 100° C. for 2 hours in a hot air circulating drier. The resulting silica had 0.3% by weight of water adsorbed.

Inorganic Water Absorbing Agent (4)

The spherical porous silica was regenerated by heating it at 250° C. for 15 minutes in a hot air circulating drier. The resulting silica had 0.15% by weight of water adsorbed.

Inorganic Water Absorbing Agent (5)

The spherical porous silica was not regenerated and had 2.6% by weight of water adsorbed.

The epoxy resin compositions were examined for spiral flow, flexural strength, glass transition temperature (Tg), and coefficient of linear expansion ($\mu$) in the same manner as above. Reliability of CCD against moisture penetration was examined as follows.

Reliability of CCD Against Moisture Penetration

A pre-molded package in the form of a hollow box 1 with a lead frame 2 interposed therein as shown in FIG. 1 was prepared by molding a composition at 175° C. and 70 kg/cm$^2$ for 2 minutes and post curing at 180° C. for 4 hours. A silicon chip 3 was mounted in a hollow cavity of the package 1, and bonding wires 4 were connected in place. A transparent glass lid 5 was sealingly joined to an opening of the package 1 with an epoxy resin adhesive 6. A test assembly was completed in this way.

This gas-tightly sealed package was allowed to stand in a hot humid atmosphere of 85° C. and RH 85% and then observed every 50 hours at room temperature whether moisture condensed on the inside surface of the glass lid to measure the time when dew condensation occurred in the package. Packages with dew condensation within 300 hours are rated "NG".

The results are shown in Tables 3 and 4.

In Tables 3 and 4, epoxy resins (1) and (2), phenolic resins (1) and (2), brominated epoxy resin, silicone-modified epoxy resin and fused silica were the same ones as above.

TABLE 3

| | Example | | | | | | |
|---|---|---|---|---|---|---|---|
| | 9 | 10 | 11 | 12 | 13 | 14 | 15 |
| Epoxy resin (1) | 9.2 | 10.3 | 10.7 | — | 9.2 | 9.2 | 9.2 |
| Epoxy resin (2) | 36.6 | 41.3 | 42.6 | — | 36.6 | 36.6 | 36.6 |
| Epoxy resin (3) | — | — | — | 44.7 | — | — | — |
| Phenolic resin (1) | 19.6 | 19.9 | — | 20.2 | 19.6 | 19.6 | 19.6 |
| Phenolic resin (2) | 19.6 | 19.9 | — | 20.2 | 19.6 | 19.6 | 19.6 |
| Phenolic resin (3) | — | — | 31.7 | — | — | — | — |
| Brominated epoxy resin | 8.6 | 8.6 | 8.6 | 8.6 | 8.6 | 8.6 | 8.6 |
| Silicone-modified epoxy resin | 6.4 | — | 6.4 | 6.4 | 6.4 | 6.4 | 6.4 |
| Inorganic water absorbing agent (1) | 50 | 50 | 50 | 50 | — | 100 | 100 |
| Inorganic water absorbing agent (2) | — | — | — | — | 50 | — | — |
| Fused silica | 400 | 400 | 400 | 400 | 400 | 400 | 500 |
| Spiral Flow (cm) | 78 | 82 | 70 | 80 | 75 | 84 | 75 |
| Flexural strength (kgf/mm$^2$) | 13.5 | 12.7 | 13.5 | 12.5 | 13.1 | 14.1 | 14.9 |
| Tg (°C.) | 145 | 146 | 141 | 152 | 143 | 144 | 143 |
| $\mu$ (10$^{-5}$/°C.) | 1.3 | 1.3 | 1.3 | 1.3 | 1.3 | 1.2 | 1.1 |
| Reliability of CCD against water penetration (hr) | 400 | 450 | 350 | 350 | 350 | 450 | 550 |

TABLE 4

| | Comparative Example | | | | | | |
|---|---|---|---|---|---|---|---|
| | 7 | 8 | 9 | 10 | 11 | 12 | 13 |
| Epoxy resin (1) | 9.2 | 9.2 | 9.2 | 9.2 | 9.2 | 9.2 | 9.2 |
| Epoxy resin (2) | 36.6 | 36.6 | 36.6 | 36.6 | 36.6 | 36.6 | 36.6 |
| Phenolic resin (1) | 19.6 | 19.6 | 19.6 | 19.6 | 19.6 | 19.6 | 19.6 |
| Phenolic resin (2) | 19.6 | 19.6 | 19.6 | 19.6 | 19.6 | 19.6 | 19.6 |
| Brominated epoxy resin | 8.6 | 8.6 | 8.6 | 8.6 | 8.6 | 8.6 | 8.6 |

TABLE 4-continued

| | Comparative Example | | | | | | |
|---|---|---|---|---|---|---|---|
| | 7 | 8 | 9 | 10 | 11 | 12 | 13 |
| Silicone-modified epoxy resin | 6.4 | 6.4 | 6.4 | 6.4 | 6.4 | 6.4 | 6.4 |
| Inorganic water absorbing agent (3) | 50 | — | — | — | — | — | — |
| Inorganic water absorbing agent (4) | — | 50 | — | — | — | — | — |
| Inorganic water absorbing agent (5) | — | — | 50 | 100 | 100 | — | — |
| Fused silica | 400 | 400 | 400 | 400 | 500 | 450 | 600 |
| Spiral Flow (cm) | 118 | 106 | 139 | 120 | 95 | 92 | 57 |
| Flexural strength (kgf/mm$^2$) | 13.1 | 13.3 | 8.9 | 13.6 | 14.3 | 13.3 | 14.7 |
| Tg (°C.) | 110 | 121 | 112 | 106 | 108 | 145 | 146 |
| $\mu$ (10$^{-5}$/°C.) | 1.2 | 1.2 | 1.3 | 1.2 | 1.1 | 1.3 | 1.1 |
| Reliability of CCD against water penetration (hr) | NG | NG | NG | NG | NG | NG | NG |

Japanese Patent Application No. 6-23684 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. An epoxy resin composition comprising at least one epoxy resin having an epoxy equivalent of 100 to 400 selected from the group consisting of a naphthalene skeleton-containing epoxy resin of the following formula (I):

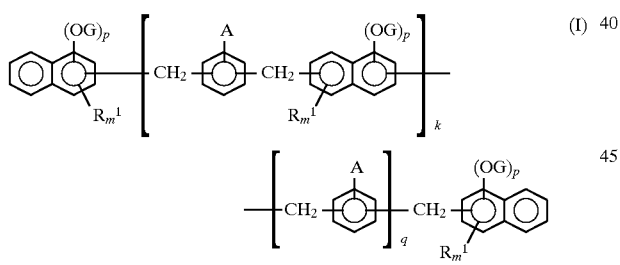

wherein R$^1$ is an alkyl group having 1 to 10 carbon atoms, OG is a glycidoxy group, A is a hydrogen atom or glycidoxy group, letter k is an integer of 0 to 5, q is an integer of 0 to 3, m is an integer of 0 to 2, and p is equal to 1 or 2, OG groups may be attached to either or both rings of the naphthalene nucleus, and a biphenyl skeleton-containing epoxy resin of the following formula (II):

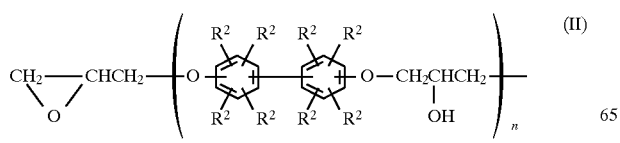

wherein R$^2$ is a hydrogen atom, halogen atom or monovalent hydrocarbon group having 1 to 5 carbon atoms, and letter n is an integer of 0 to 5, at least one curing agent having a hydroxyl equivalent of 90 to 250 selected from the group consisting of a naphthalene skeleton-containing phenolic resin of the following formula

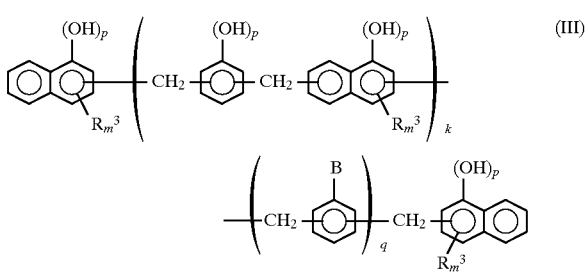

wherein R$^3$ is an alkyl group having 1 to 10 carbon atoms, B is a hydroxyl group or hydrogen atom, letter k is an integer of 0 to 5, q is an integer of 0 to 3, m is an integer of 0 to 2, and p is equal to 1 or 2, OH groups may be attached to either or both rings of the naphthalene nucleus, and an aralkyl skeleton-containing phenolic resin of the following formula (IV):

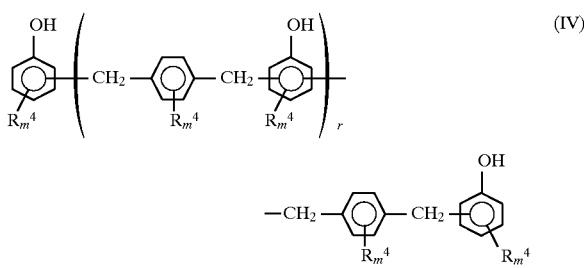

wherein R$^4$ is a hydrogen atom or alkyl group having 1 to 10 carbon atoms, letter m is an integer of 0 to 2, and r is an integer of 1 to 5, in an amount of 50 to 80 parts by weight per 100 parts by weight of the epoxy resin, an inorganic filler having a mean weight diameter of about 5 to 30 $\mu$m in an amount of about 200 to 1200 parts by weight per 100 parts by weight of the epoxy resin and curing agent combined, and an inorganic water absorbing agent having a mean weight diameter of 0.5 to 20 $\mu$m selected from the group consisting of molecular sieve, silica gel, porous silica having a specific surface area of 10 to 200 m$^2$/g, and active alumina other than said inorganic filler, in an amount of 1 to 50% by weight based on the weight of the entire composition, said inorganic water absorbing agent being regenerated at 200° to 300° C. for about 2 to 12 hours prior to use, wherein said regenerated inorganic water absorbing agent has an adsorbed water content of 0.1% by weight or less, said composition curing into a product having a coefficient of water diffusion of up to 1×10$^{-4}$ cm$^2$/hr. as measured at a thickness of 3 mm under humid conditions at 85° C. and RH 85%.

2. The epoxy resin composition according to claim 1, wherein the epoxy resin is a naphthalene skeleton-containing epoxy resin of formula (I) having less than 10% by weight of glycidyl ethers of α-naphthol and α,β-naphthol, and less than 0.5% by weight bi-nuclear compound of phenol and phenyl glycidyl ether.

3. The epoxy resin composition according to claim 1, wherein the water absorbing agent is surface treated with a hydrophilic surface treating agent.

4. The epoxy resin composition according to claim 1, wherein the inorganic filler is fused silica, crystalline silica, alumina, silicon nitride, or alumina nitride.

5. The epoxy resin composition according to claim 1, wherein said composition cures into a product having a coefficient of water diffusion ranging from $1\times10^{-5}$ to $7\times10^{-5}$ cm$^2$/hr. as measured at a thickness of 3 mm under humid conditions at 85° C. and RH 85%.

6. The epoxy resin composition according to claim 1, wherein the epoxy resins are

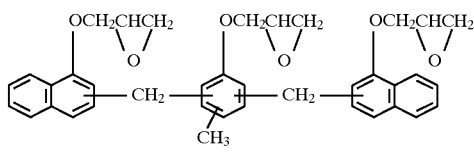

and

-continued

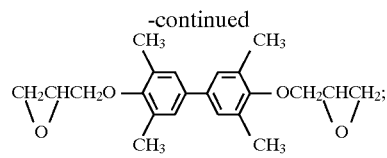

the curing agents are

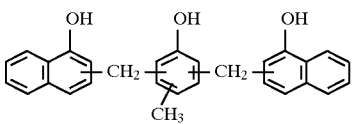

and

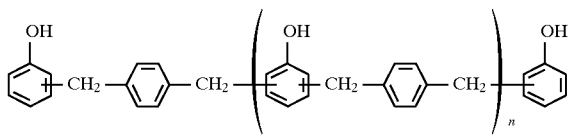

where n is an integer from 0 to 5;
the inorganic filler is fused spherical silica; and
the inorganic water absorbing agent is porous silica.

7. The epoxy resin composition according to claim 1, wherein the epoxy resin is a naphthalene skeleton-containing epoxy resin of formula (I) having a softening point of 50° to 120° C.

8. The epoxy resin composition according to claim 1, wherein the epoxy resin is a naphthalene skeleton-containing epoxy resin having the formula:

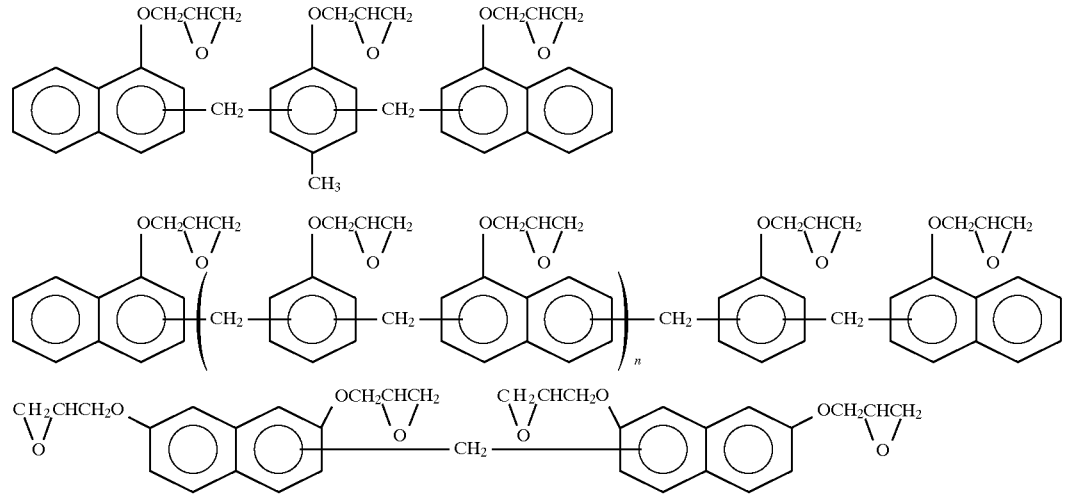

or

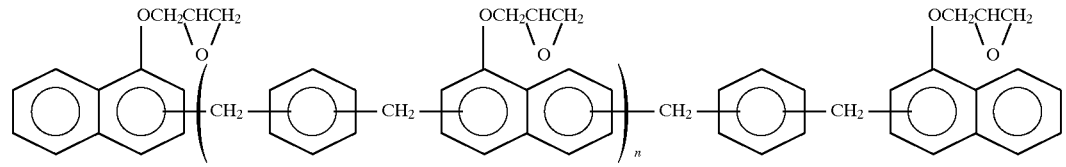

wherein n is an integer from 0 to 5.

9. The epoxy resin composition according to claim 1, wherein the epoxy resin is a biphenyl skeleton-containing epoxy resin having the formula:

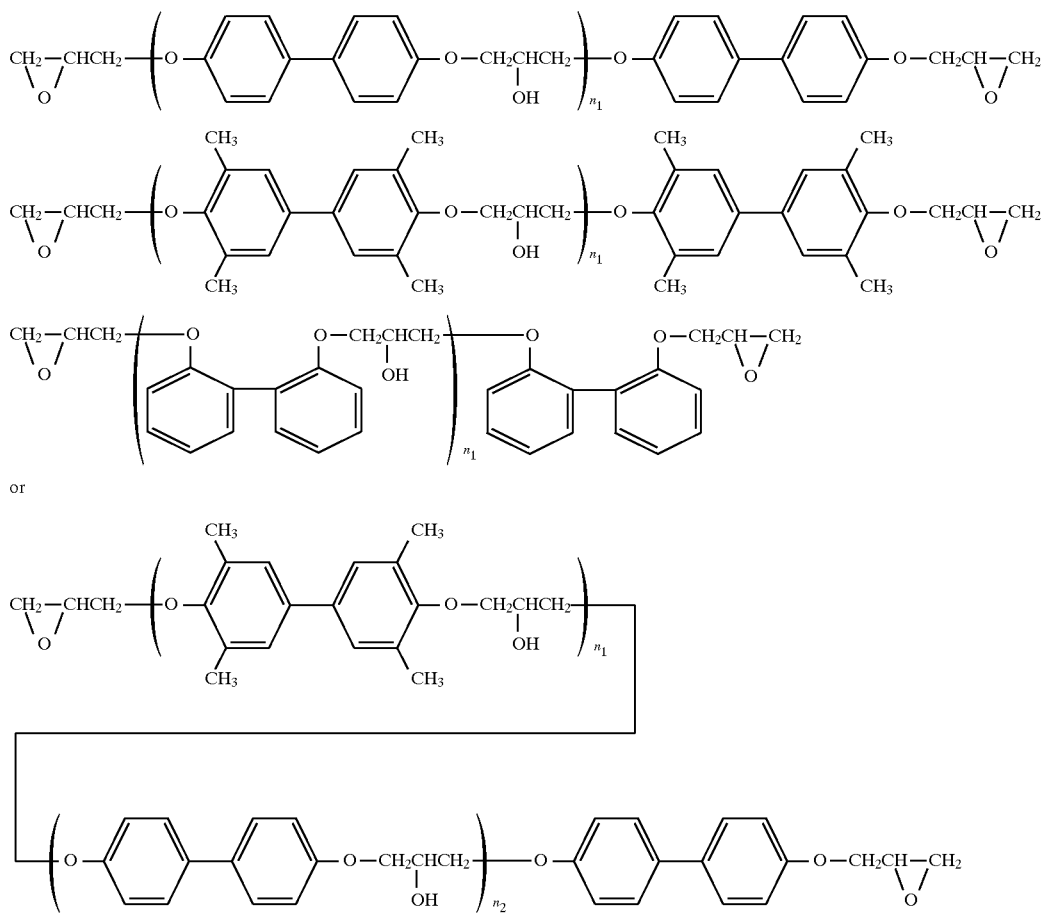
wherein $n_1$ is an integer from 0 to 5, $n_2$ is an integer from 0 to 5 and $n_1+n_2$ is an integer from 0 to 5.
10. The epoxy resin composition according to claim 1, wherein the curing agent is a naphthalene skeleton-containing phenolic resin having the formula:
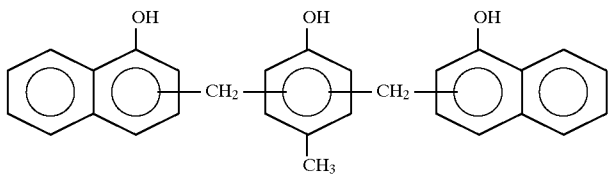
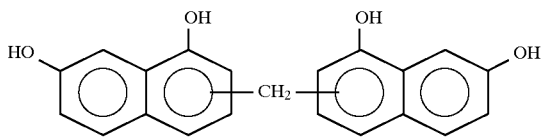
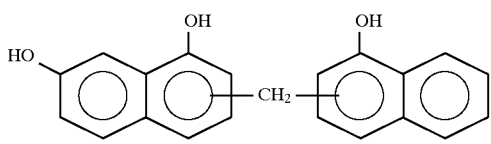

-continued

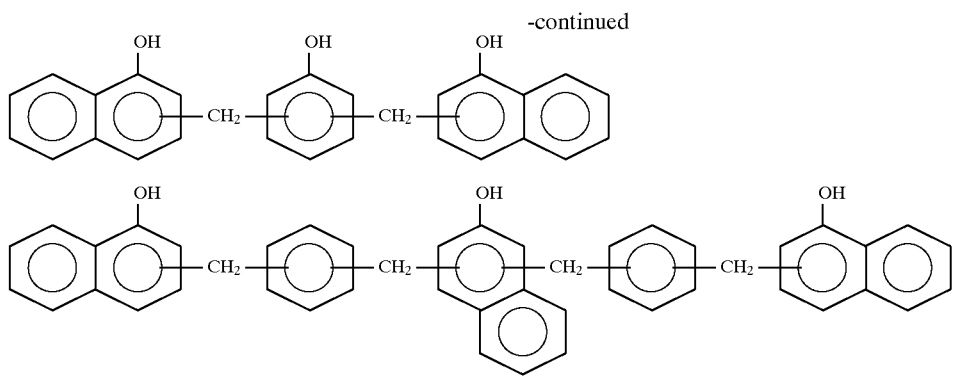

or

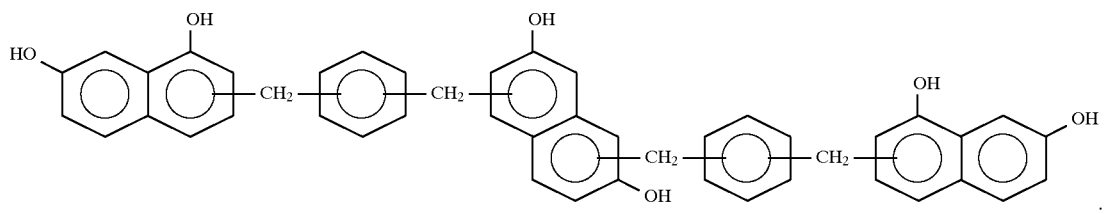

11. The epoxy resin composition according to claim 1, wherein the curing agent is an aralkyl skeleton-containing phenolic resin having the formula:

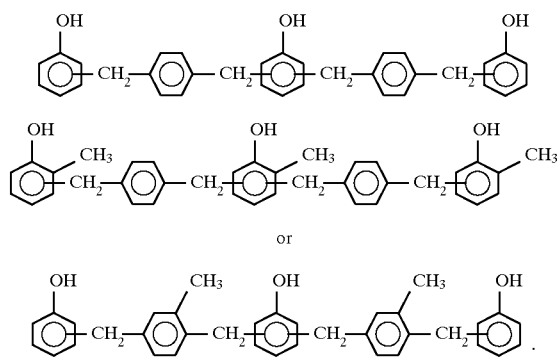

12. The epoxy resin composition according to claim 1, wherein the regenerated inorganic water absorbing agent has an adsorbed water content of 0.08% by weight or less.

13. The epoxy resin composition according to claim 12, wherein the regenerated inorganic water absorbing agent has an adsorbed water content in the range of 0.05 to 0.06% by weight.

14. The epoxy resin composition according to claim 1, wherein said inorganic water absorbing agent is molecular sieve.

15. The epoxy resin composition according to claim 1, wherein said inorganic water absorbing agent is porous silica.

16. The epoxy resin composition according to claim 1, wherein said inorganic water absorbing agent is silica gel.

17. The epoxy resin composition according to claim 1, wherein said inorganic water absorbing agent is active alumina.

* * * * *